United States Patent
Kuo et al.

(10) Patent No.: US 9,618,536 B2
(45) Date of Patent: Apr. 11, 2017

(54) PROBE NEEDLE AND PROBE MODULE USING THE SAME

(71) Applicant: MPI CORPORATION, Chu-Pei (TW)

(72) Inventors: Chia-Yuan Kuo, Chu-Pei (TW);
Tien-Chia Li, Chu-Pei (TW);
Ming-Chi Chen, Chu-Pei (TW);
Chien-Chou Wu, Chu-Pei (TW);
Tsung-Yi Chen, Chu-Pei (TW)

(73) Assignee: MPI Corporation, Chu-Pei, Hsinchu Shien (TW)

( * ) Notice: Subject to any disclaimer, the term of this patent is extended or adjusted under 35 U.S.C. 154(b) by 231 days.

(21) Appl. No.: 14/294,958

(22) Filed: Jun. 3, 2014

(65) Prior Publication Data

US 2014/0352460 A1    Dec. 4, 2014

(30) Foreign Application Priority Data

Jun. 3, 2013    (TW) .............................. 102119652 A
May 19, 2014   (TW) .............................. 103117527 A (51) Int. Cl.
G01D 11/00    (2006.01)
G01R 1/073    (2006.01)
G01R 1/067    (2006.01)

(52) U.S. Cl.
CPC ....... *G01R 1/07357* (2013.01); *G01R 1/0675* (2013.01)

(58) Field of Classification Search
CPC .... G01R 31/2886; G01R 1/073; G01R 1/067; G01R 31/00; G01D 11/00
USPC ....................................... 73/866.5
See application file for complete search history.

(56) References Cited

U.S. PATENT DOCUMENTS

| 7,417,447 | B2* | 8/2008 | Kister | G01R 1/07371 324/750.16 |
| 7,786,740 | B2* | 8/2010 | Kister | G01R 1/07314 324/754.03 |
| 2002/0123252 | A1* | 9/2002 | Zhou | H01R 12/57 439/66 |
| 2002/0127894 | A1* | 9/2002 | Brodsky | H01L 23/4006 439/66 |
| 2003/0057957 | A1* | 3/2003 | McQuade | G01R 3/00 324/537 |
| 2004/0157350 | A1* | 8/2004 | McQuade | G01R 1/06744 438/14 |
| 2008/0054919 | A1* | 3/2008 | Wu | G01R 1/07371 324/756.04 |

(Continued)

*Primary Examiner* — Harshad R Patel
*Assistant Examiner* — Monica S Young
(74) *Attorney, Agent, or Firm* — Muncy, Geissler, Olds & Lowe, P.C.

(57) ABSTRACT

A probe needle includes a head, a tail and a body connected between the head and the tail and provided with a first flat section curvedly extending from the head towards the tail for providing sufficient deformation when the tail is pressed on a device under test, and a second flat section neighbored to the first flat section for supporting the probe needle in between upper and lower dies. When the probe needles are used in a probe module, the probe needles can be arranged with a pitch same as that of the conventional probe needles even though the probe needles are formed from posts having a relatively greater diameter than that of the posts for making the conventional probe needles, such that the probe needles may have enhanced current withstanding capacity and prolonged lifespan.

8 Claims, 12 Drawing Sheets

(56) References Cited

U.S. PATENT DOCUMENTS

| | | | | |
|---|---|---|---|---|
| 2008/0238452 A1* | 10/2008 | McQuade | ............ | G01R 1/0675 |
| | | | | 324/755.01 |
| 2009/0096474 A1* | 4/2009 | Rogers | ................ | G01R 1/0735 |
| | | | | 324/750.19 |
| 2011/0006796 A1* | 1/2011 | Kister | ................ | G01R 1/07314 |
| | | | | 324/756.01 |
| 2012/0319711 A1* | 12/2012 | Hung | ................ | G01R 1/07371 |
| | | | | 324/750.16 |
| 2013/0069683 A1* | 3/2013 | Kuo | ................... | G01R 1/0491 |
| | | | | 324/755.03 |

* cited by examiner

PROBE NEEDLE AND PROBE MODULE USING THE SAME

CROSS-REFERENCE TO RELATED APPLICATIONS

This application claims priorities from Taiwan Patent Application No. 102119652 filed on Jun. 3, 2013 and Taiwan Patent Application No. 103117527 filed on May 19, 2014, the entire contents of which are incorporated herein by reference.

BACKGROUND OF THE INVENTION

1. Field of the Invention

The present invention relates generally to probe needles used in a probing apparatus for probing devices under test and more particularly, to a probe needle having enhanced current withstanding capacity and prolonged lifespan and a probe module using the same.

2. Description of the Related Art

Figure 1:
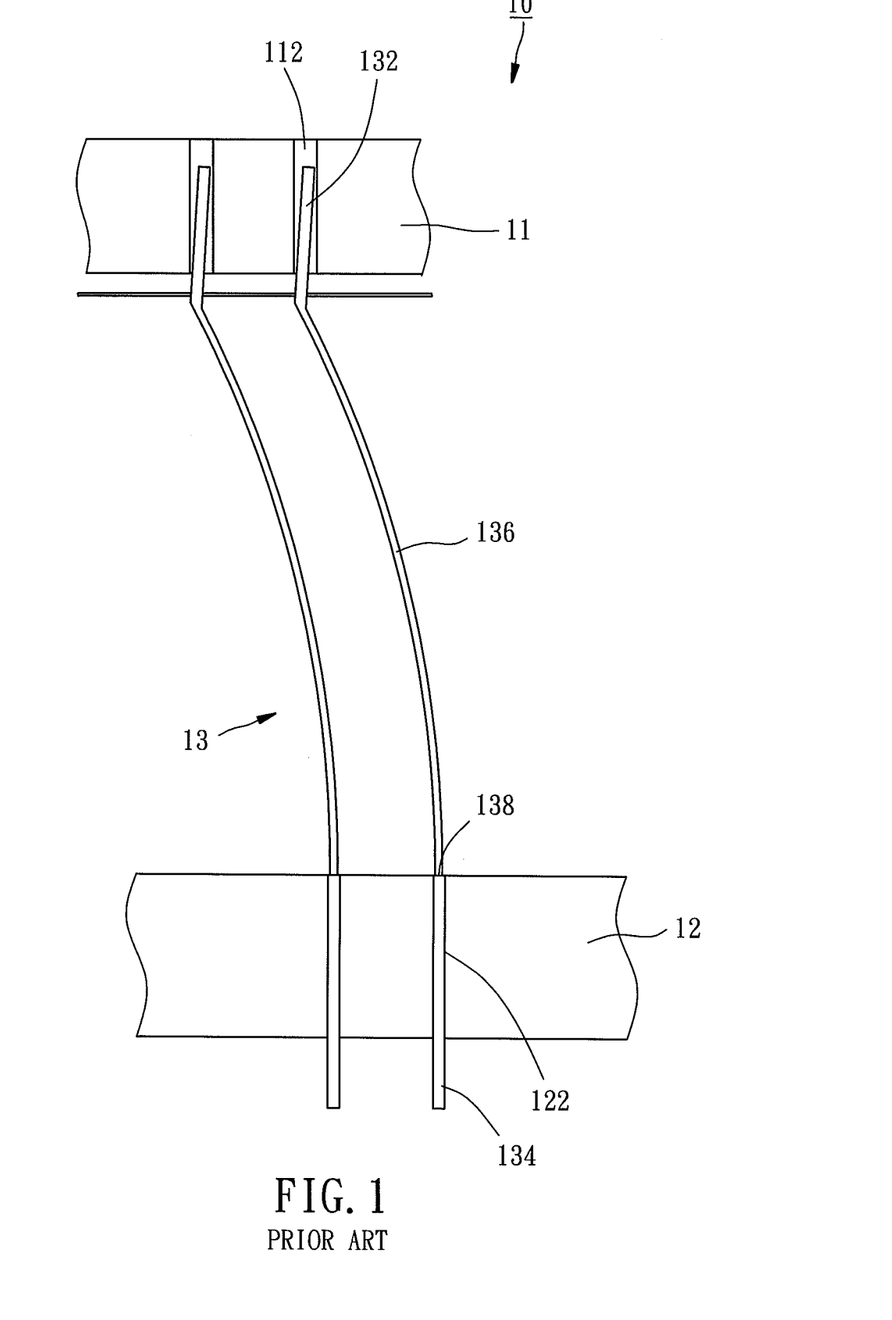
FIG. 1 is a schematic front view of a probe module according to a prior art.
Figure 2:
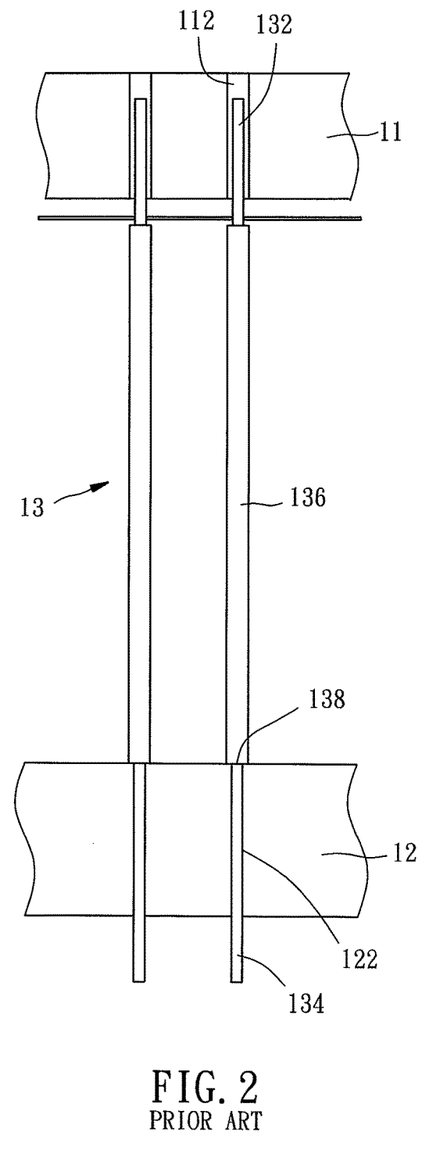
FIG. 2 is a schematic lateral side view of the probe module according to the prior art.

FIGS. 1-2 show a conventional vertical probe module 10 comprising an upper die 11, a lower die 12 corresponding in location to the upper die 11, and a plurality of vertical probe needles 13 of buckling type arranged in between the upper and lower dies 11 and 12. The upper die 11 has a plurality of upper guide holes 112 through which the heads 132 of the probe needles 13 are respectively inserted, and the lower die 12 has a plurality of lower guide holes 122 through which the tails 134 of the probe needles 13 are respectively inserted. By press working, the body 136 of each probe needle 13 is press-formed from a section of a cylindrical post into a flat buckling shape in a way that a stop portion 138 having a maximum width greater than the diameter of the lower guide hole 122 is formed at the joint between the body 136 and the tail 134 for being stopped at the top surface of the lower die 12. When the tails 134 of the probe needles 13 are pressed on pads of a device under test, the bodies 136 of the probe needles 13 will deform in a same, fixed direction due to the flat buckling configuration of the bodies 136, such that a stable contact force may be provided by the tail 134 of each probe needle 13 to the pad of the device under test.

Figure 3:
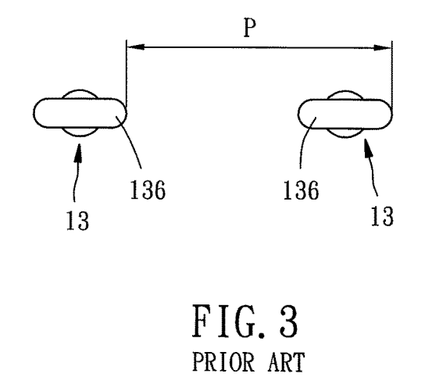
FIG. 3 is a schematic transverse sectional view showing two probe needles of the probe module according to the prior art.

To meet the testing requirement of small-sized electronic devices, the conventional probe module has to be developed with a small pitch between each two adjacent probe needles. For accomplishing the goal of small pitch or fine pitch, one approach that can be adopted is to reduce the distance between two adjacent probe needles, and the other is to make the probe needles having a relatively smaller diameter than that of the conventional ones. Referring to FIG. 3, if the pitch P between two adjacent probe needles 13, i.e. the distance from a side edge of one probe needle to the corresponding side edge of the other probe needle or the center-to-center distance between the two adjacent probe needles, is reduced under the condition that the diameter of the probe needles remains unchanged, the risk of short circuit may increase because the flat buckling bodies 136, especially the upper sections of the flat buckling bodies 136, tend to be unintentionally contacted with each other when they are deformed upon receiving external force. On the other hand, if the probe needles 13 are press-made from cylindrical posts having a relatively smaller diameter than the conventional ones to enable that the probe needles 13 can be arranged in a relatively smaller pitch within a safety range, the current withstanding capacity of the probe needles may however drop down to adversely affect the lifespan of the probe needles.

SUMMARY OF THE INVENTION

The present invention has been accomplished in view of the above-noted circumstances. It is an objective of the present invention to provide probe needles for a probe module, which can be arranged in a safety distance substantially equal to the safety distance of conventional probe needles even though they are made from cylindrical posts having a larger diameter than that of the cylindrical posts for making the conventional probe needles, provided that the pitch between probe needles of the present invention is set substantially equal to the pitch of the conventional probe needles, thereby lowering the risk of short circuit due to contact of the probe needles when they are deformed upon receiving external force. Since the probe needle of the present invention can be made from a cylindrical post having a larger diameter than that of the conventional ones, the current withstanding capacity of the probe needle can be enhanced and the lifespan of the probe needle can be prolonged.

To achieve the above-mentioned objective, a probe needle provided by the present invention comprises a head, a tail, and a body connected between the head and the tail and provided with a first flat section and a second flat section connected with an end of the first flat section. The second flat section may be neighbored to the tail for being supported on a lower die, or neighbored to the head for being supported on a positioning film. The first flat section curvedly extends from the head towards the tail and has a constant width greater than a thickness of the second flat section, a diameter of the head and a diameter of the tail. The first flat section has a thickness smaller than a width of the second flat section, the diameter of the head and the diameter of the tail. The width of the second flat section is greater than the thickness of the first flat section, the diameter of the head and the diameter of the tail. The width of the second flat section extends in a first direction and the width of the first flat section extends in a second direction in a way that the first direction is not parallel to the second direction when the first and second directions are projected on a horizontal plane.

Preferably, the first direction is orthogonal to the second direction when the first and second directions are projected on the horizontal plane.

To achieve the above-mentioned objective, the present invention provides another probe needle comprising a head, a tail, and a flat body connected and curvedly extending between the head and the tail for enabling suitable deformation when the probe needle receives an external force. The flat body has a width gradually increasing from the head towards the tail, such that a stop portion having a maximum width is formed at the joint between the body and the tail for serving as a stopper for being supported on a lower die of a probe module.

To achieve the above-mentioned objective, the present invention provides still another probe needle comprising a head, a tail, and a flat body connected and curvedly extending between the head and the tail. The flat body has a first side edge in flush with a circumference of the head and a circumference of the tail, and a second side edge opposite to the first side edge and protruding out of the circumferences of the head and the tail for serving as a stopper for being supported on a lower die of the probe module.

Another aspect of the present invention is to provide a probe module comprising an upper die, a lower die, and a plurality of above-mentioned probe needles arranged in between the upper and lower dies in such a way that the tails of the probe needles protrude out of the lower die.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

It is to be understood that the drawings disclosed in the present invention are given by way of schematically illustrating the structural features of the present invention only; therefore, they are not, or need not to be, sketched according to actual dimension.

Figure 4:
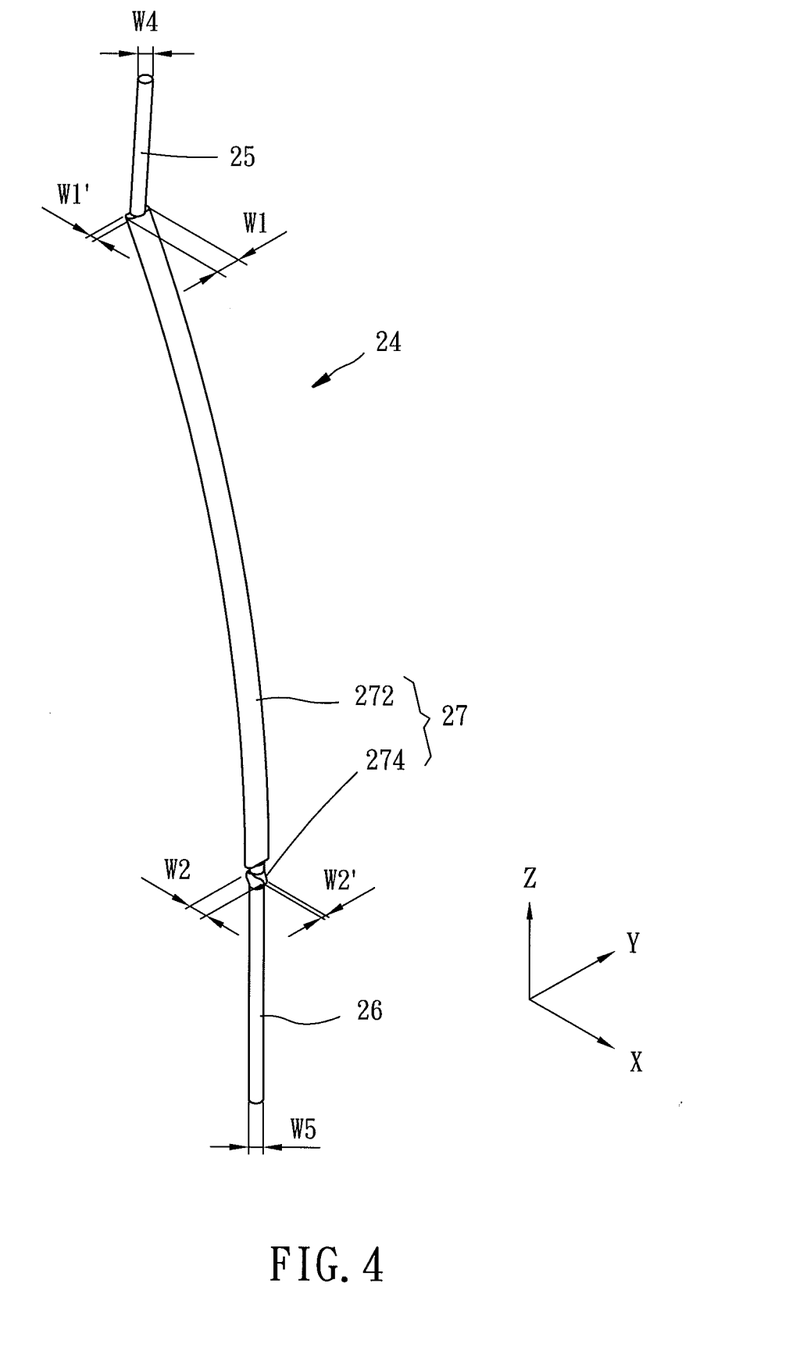
FIG. 4 is a schematic perspective view of a probe needle according to a first embodiment of the present invention.
Figure 5:
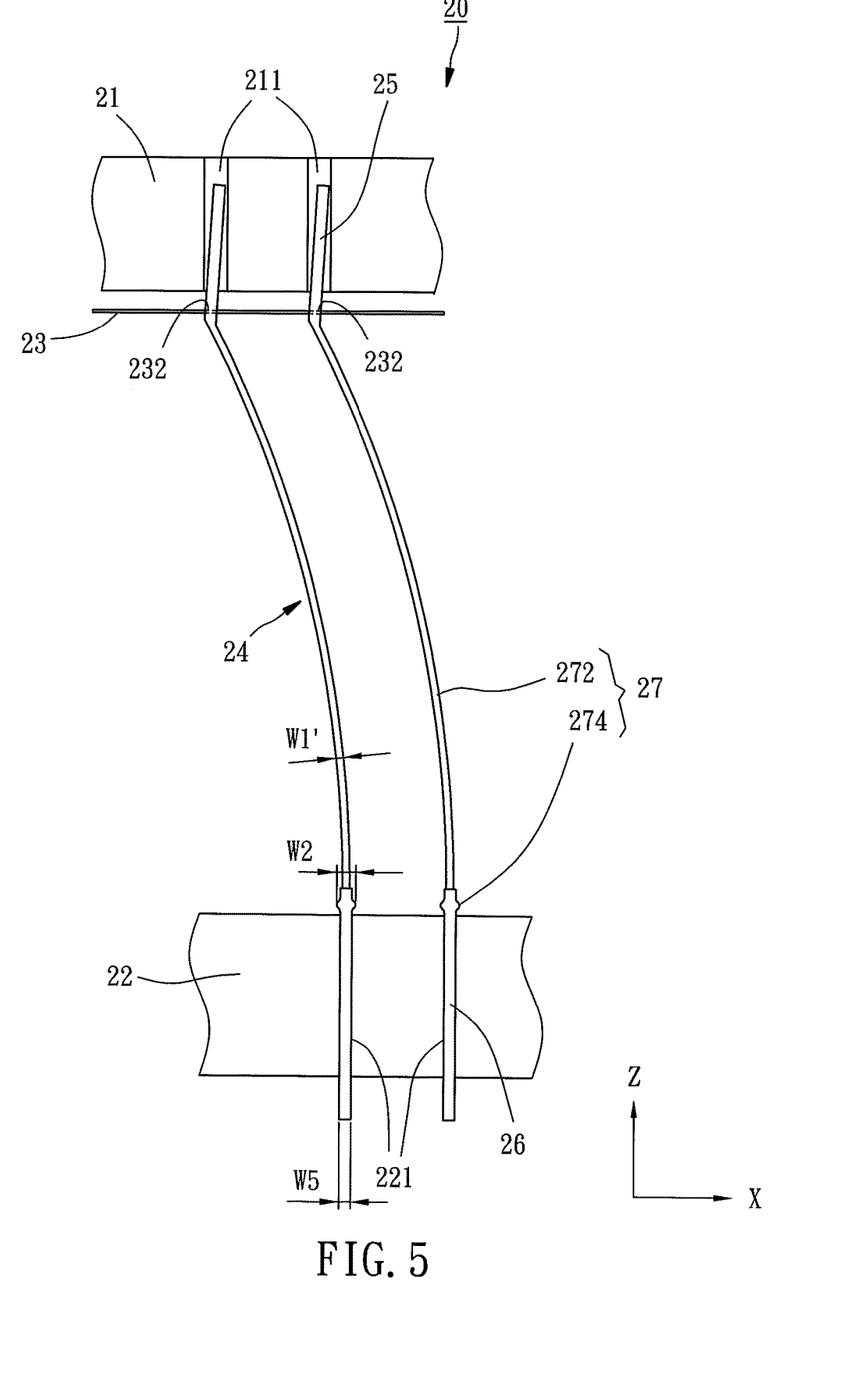
FIG. 5 is a schematic front view of a probe module using the probe needles of the first embodiment of the present invention.

Referring to FIGS. 4-5, a probe module 20 is shown comprising an upper die 21, a lower die 22, a positioning film 23, and a plurality of probe needles 24 provided according to a first embodiment of the present invention. It is to be understood that the probe module 20 may comprise several tens or hundreds of probe needles 24 arranged in a matrix manner; however, only two probe needles 24 are sketched in FIGS. 4 and 5 for the purpose of concise illustration.

The upper die 21 has a plurality of upper guide holes 211 spacedly arranged from each other. The lower die 22 is arranged corresponding in location to the upper die 21 and provided with a plurality of lower guide holes 221 spacedly arranged from each other.

The positioning film 23 is disposed between the upper and lower dies 21 and 22 at a location adjacent to the upper die 21. The positioning film 23 has a plurality of positioning holes 232 spacedly arranged from each other.

Figure 6:
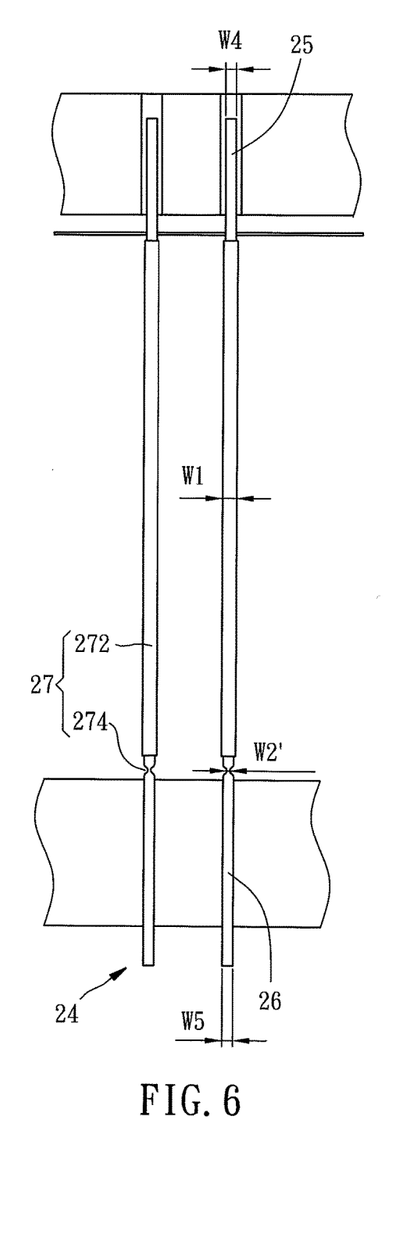
FIG. 6 is a schematic lateral side view of the probe module using the probe needles of the first embodiment of the present invention.

Referring to FIGS. 4-6, each probe needle 24 includes a head 25, a tail 26, and a body 27 connected between the head 25 and the tail 26. In this embodiment, the body 27, which is formed by press working from a section of a cylindrical post, has a first flat section 272 with a width W1 and a thickness W1', and a second flat section 274 with a width W2 and a thickness W2'. The second flat section 274 is integrally connected between the bottom end of the first flat section 272 and the top end of the tail 26. The first flat section 272 of the body 27 curvedly extends from the head 25 towards the tail 26 with a same width, i.e. the whole first flat section 272 has a constant width W1, and protrudes in a first direction, i.e. the X-axis direction as shown in FIG. 4, such that the tail 26 is offset from the head 25 at a predetermined distance, i.e. the tail 26 is not in alignment with the head 25. When the probe needle 24 is viewed from the first direction as shown in FIG. 6, the width W1 of the first flat section 272 of the body 27 is greater than the thickness W2' of the second flat section 274, the diameter W4 of the head 25 and the diameter W5 of the tail 26. As shown in FIG. 5, when the probe needle 24 is viewed from a second direction (Y-axis direction in FIG. 4) orthogonal to the first direction, the thickness W1' of the first flat section 272 is smaller than the width W2 of the second flat section 274, the diameter W4 of the head 25 and the diameter W5 of the tail 26. In addition, the width W2 of the second flat section 274 of the body 27 is greater than the thickness W1' of the first flat section 272, the diameter W4 of the head 25, the diameter W5 of the tail 26 and the diameter of the lower guide hole 221 of the lower die 22. Preferably, the width W2 of the second flat section 274 is equal to or greater than the width W1 of the first flat section 272. More preferably, the width W2 of the second flat section 274 is greater than the width W1 of the first flat section 272. The second flat section 274 of the body 27 is formed by pressing a section of a cylindrical post into a flat shape. In press working, the cylindrical post is pressed in a direction located in an imaginary horizontal plane (XY plane as shown in FIG. 4) and not in parallel to the first direction (X-axis direction in FIG. 4) to form the second section of flat shape. That is, the extending direction (Y-axis direction in this embodiment) of the width W1 of the first flat section 272 of the body 27 is not in parallel to the extending direction (X-axis direction in this embodiment) of the width W2 of the second flat section 274 when they are projected on a horizontal plane, e.g. XY plane. Preferably, the pressing direction is in parallel to the second direction (Y-axis direction in FIG. 4), such that the first flat section 272 and second flat section 274 of the body 27 are formed orthogonal to each other. That is, the extending direction (Y-axis direction) of the width W1 of the first flat section 272 of the body 27 is orthogonal to the extending direction (X-axis direction) of the width W2 of the second flat section 274 when they are projected on the horizontal plane (XY plane).

In assembly, the tails 26 of the probe needles 24 are respectively inserted through the lower guide holes 221 of the lower die 22, and the heads 25 of the probe needles 24, which are held in position by the help of the positioning holes 232 of the positioning film 23, are respectively inserted through the upper guide holes 211 of the upper die 21, such that the first flat sections 272 of the bodies 27 of the probe needles 24 are located in between the upper and lower dies 21 and 22 and the second flat sections 274 of the bodies 27 of the probe needles 24 are stopped at the surface of the lower die 22 that faces the upper die 21. By this design, the second flat section 274 may serve as a stopper for enabling the probe needle 24 to be supported and stably kept between the upper and lower dies 21 and 22 so as to prevent the probe needle 24 from escape. When the probe module 20 is used in a probing task, the second flat sections 274 of the bodies 27 of the probe needles 24 will slightly move towards the upper die 21 as soon as the tails 26 of the probe needles 24 are pressed on a device under test, resulting in that the first flat sections 272 of the bodies 27 of the probe needles 24 will deform in a first direction (X-axis direction in FIG. 4) due to the reaction force from the device under test. By means of deformation, the first flat sections 272 of the bodies 27 of the probe needles 24 can offer not only a buffering effect to protect the tails 26 or the device under test from damage but also an appropriate contact force that enables the tails 26 to stably contact the pads of the device under test.

Figure 7:
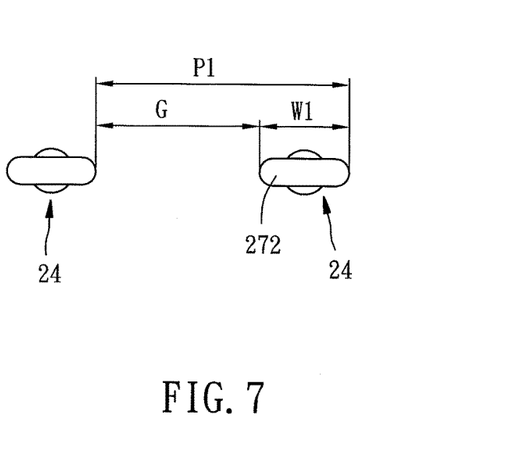
FIG. 7 is a schematic transverse sectional view showing two probe needles of the first embodiment of the present invention.

As illustrated above, the probe needle 24 of the first embodiment of the present invention utilizes the second flat section 274 of the body 27 as a stopper to support the probe needle 24 in between the upper and lower dies 21 and 22, so that the first flat section 272 can be configured having a deformable function without a support structure. Therefore, when the probe needle 24 of the present invention is formed by press working from a cylindrical post having a diameter equal to that of the cylindrical post for making the conventional probe needle, the width W1 of the first flat section 272 can be press-formed having a relatively smaller dimension compared to the width of the flat body of the conventional probe needle. In this way, when the probe needles 24 of the present invention are arranged in the probe module with a pitch equal to that of the conventional probe needles, the first flat sections 272 of the bodies 27 will not be easy to contact with each other compared to the wider flat bodies of the conventional probe needles. In other words, when the probe needles of the present invention are used in a probe module, they can be arranged in a pitch smaller than that of the conventional probe needles so as to fulfill the needs of fine-pitch probing task. On the other hand, if the probe needles 24 are used in a probe module with a pitch equal to that of the conventional probe needles, the probe needles 24, which have a special structural design in the present invention, can be maintained at a safety distance thereamong even though they are press-formed from cylindrical posts having a relatively greater diameter than that of the cylindrical posts for making the conventional probe needles. Specifically speaking, as shown in FIG. 7, because the pitch P1 of two adjacent probe needles 24, i.e. the center-to-center or edge-to-edge distance between two adjacent probe needles 24, is the sum of the gap G between two adjacent probe needles 24 and the width W1 of the first flat section 272 of the body 27 of one probe needle 24, the pitch P1 may vary depending on the magnitude of the width W1 of the first flat section 272, provided that the gap G between two adjacent probe needles 24 is fixed. When the probe needle 24 is press-formed with a reduced width W1 of the first flat section 272 of the body 27 thereof and the probe needles 24 thus obtained are used in a probe module in a way that the center-to-center distance of each two adjacent probe needles 24 is remained the same as the conventional one, the risk of short circuit caused by contact of two adjacent probe needles upon deformation will be reduced because the safety distance between two adjacent probe needles is relatively increased. Under this circumstance, on one hand, the probe needles 24 can be arranged with a reduced pitch P1 but a same safety gap G, provided that the probe needles 24 are press-formed from cylindrical posts having a diameter same as that of cylindrical posts for making the conventional probe needles, and have a reduced width W1 of the first flat sections 272 thereof. Therefore, the probe needles 24 arranged in a denser manner can be provided in between the upper and lower dies 21 and 22 to fulfil actual needs of fine-pitch probing task. On the other hand, the probe needles 24 can be arranged with a same pitch P1 and a same safety gap G as the conventional probe needles do even though the probe needles 24 are press-formed from cylindrical posts having a diameter greater than that of the cylindrical posts for making the conventional probe needles. In this way, the current withstanding capacity of the probe needle 24 can be enhanced and the lifespan of the probe needle 24 can be prolonged compared to the conventional probe needle that is press-formed from a cylinder post have a relatively smaller diameter.

Figure 8:
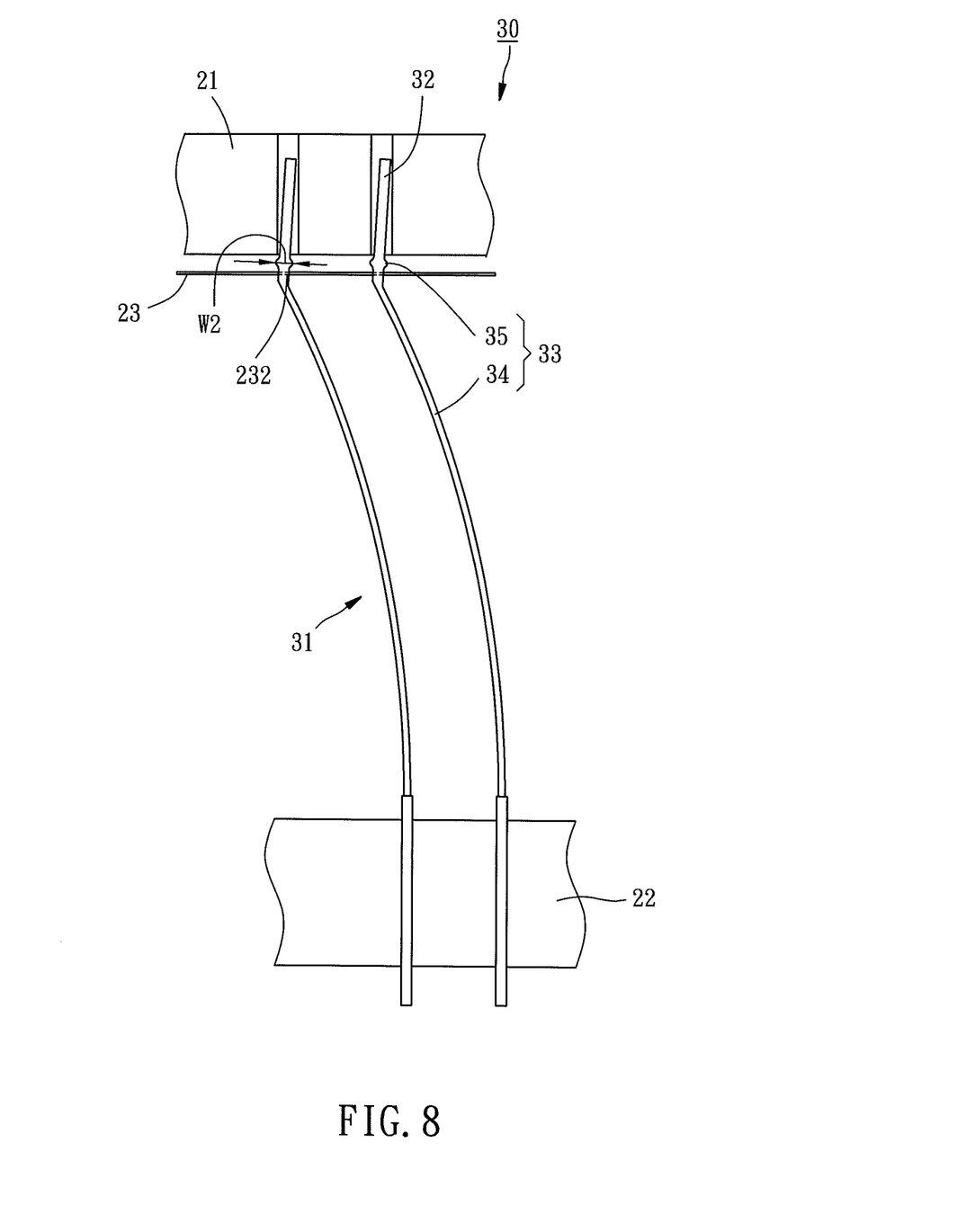
FIG. 8 is a schematic front view of a probe module using probe needles according to a second embodiment of the present invention.
Figure 9:
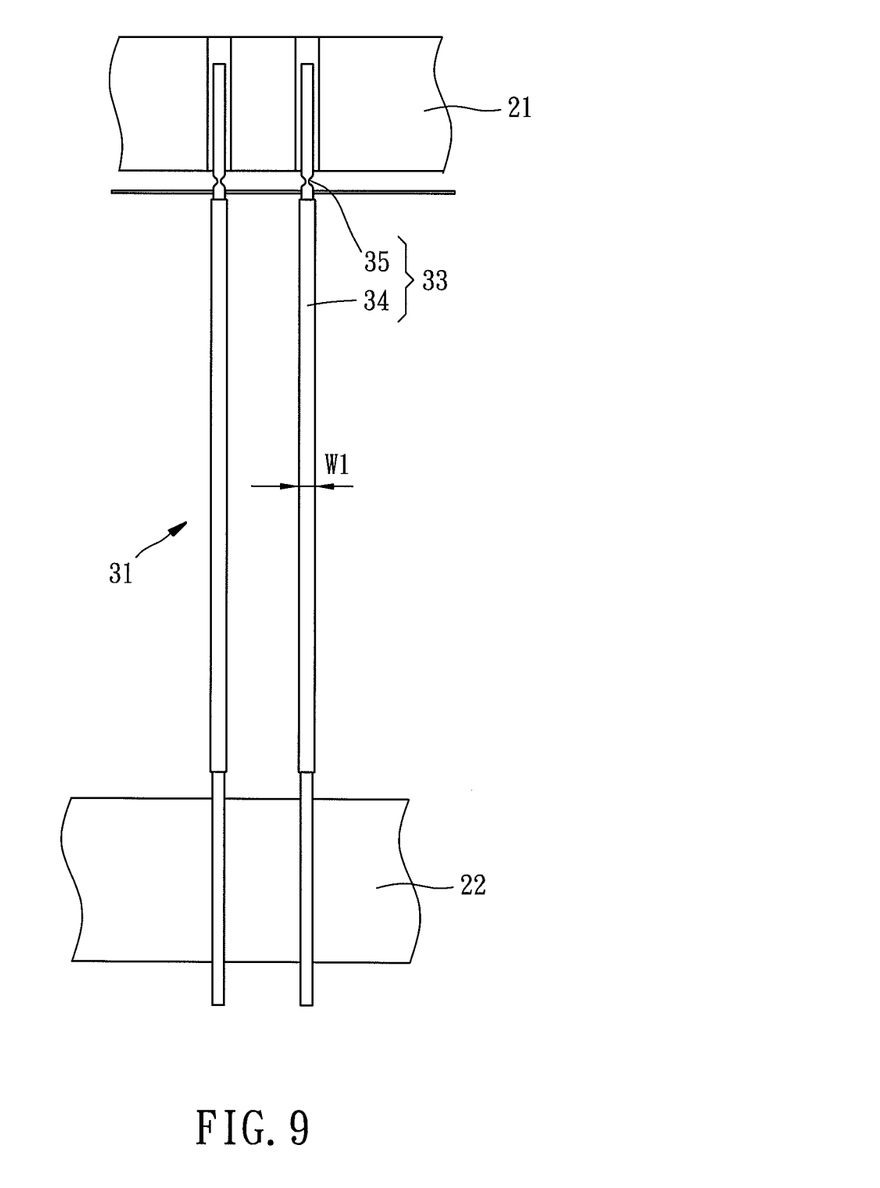
FIG. 9 is a schematic lateral side view of the probe module using the probe needles of the second embodiment of the present invention.

FIGS. 8 and 9 show a probe module 30 using probe needles 31 provided in accordance with a second embodiment of the present invention. The difference between the probe needle 24 of the first embodiment and the probe needle 31 of the second embodiment lies in that the first flat section 34 of the body 33 of the probe needle 31 is located between the positioning film 23 and the lower die 22, the second flat section 35 of the body 33 of the probe needle 31 is connected between the top end of the first flat section 34 and the bottom end of the head 32, and the width W2 of the second flat section 35 of the body 33 of the probe needle 31 is greater than the diameter of the positioning hole 232 of the positioning film 23, such that the second flat section 35 can be stopped at the surface of the positioning film 23 that faces the upper die 21 for supporting the probe needle 31 in position in between the upper and lower dies 21 and 22 so as to prevent the probe needle 31 from escape. The probe needle 31 of this embodiment can also be press-formed with a reduced width W1 of the first flat section 34 of the body 33 so as to achieve the same effect of the probe needle 24 of the first embodiment.

Figure 10:
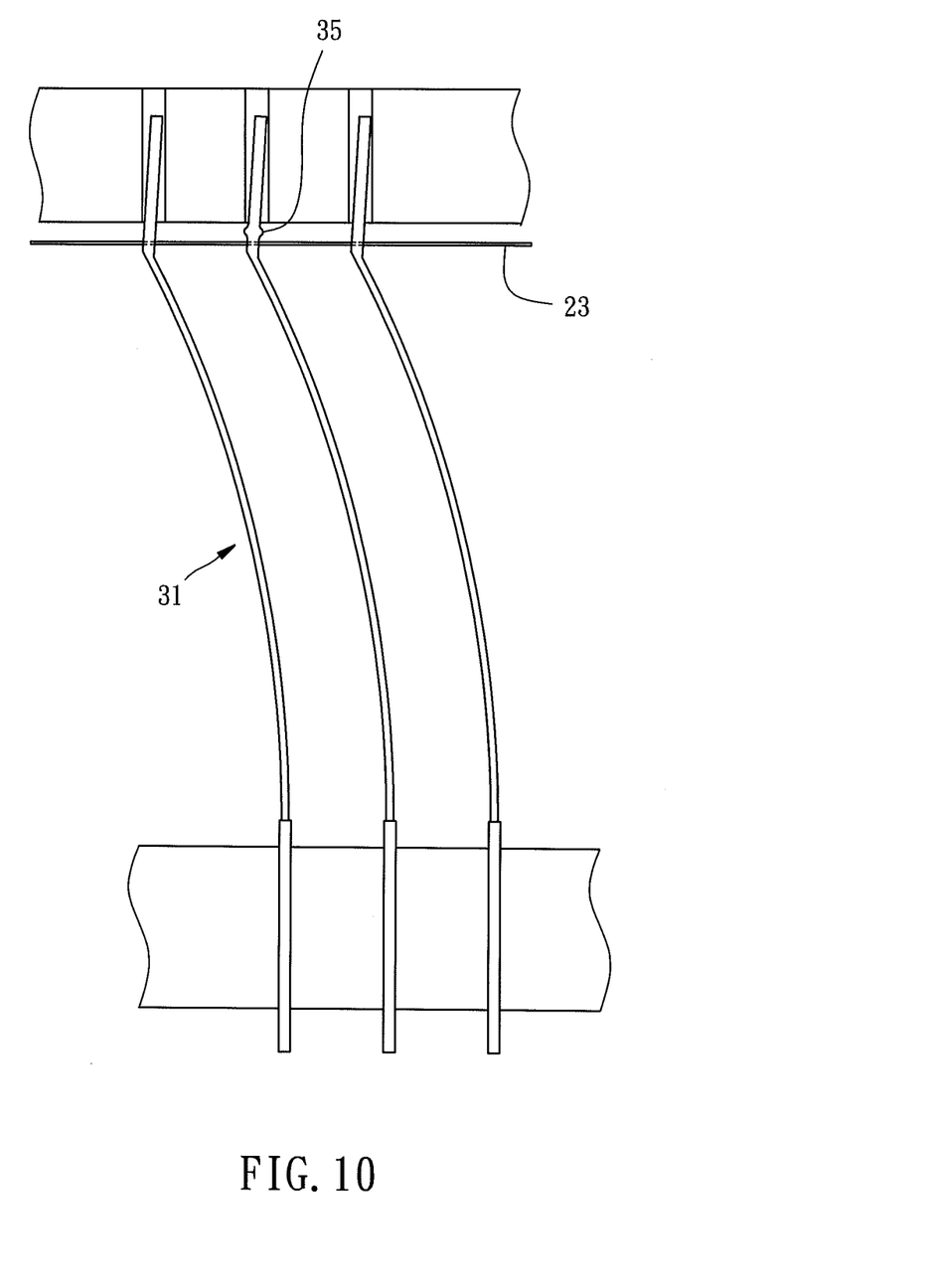
FIG. 10 is a schematic front view of a probe module showing that one probe needle of the second embodiment of the present invention is used in the probe module.
Figure 11:
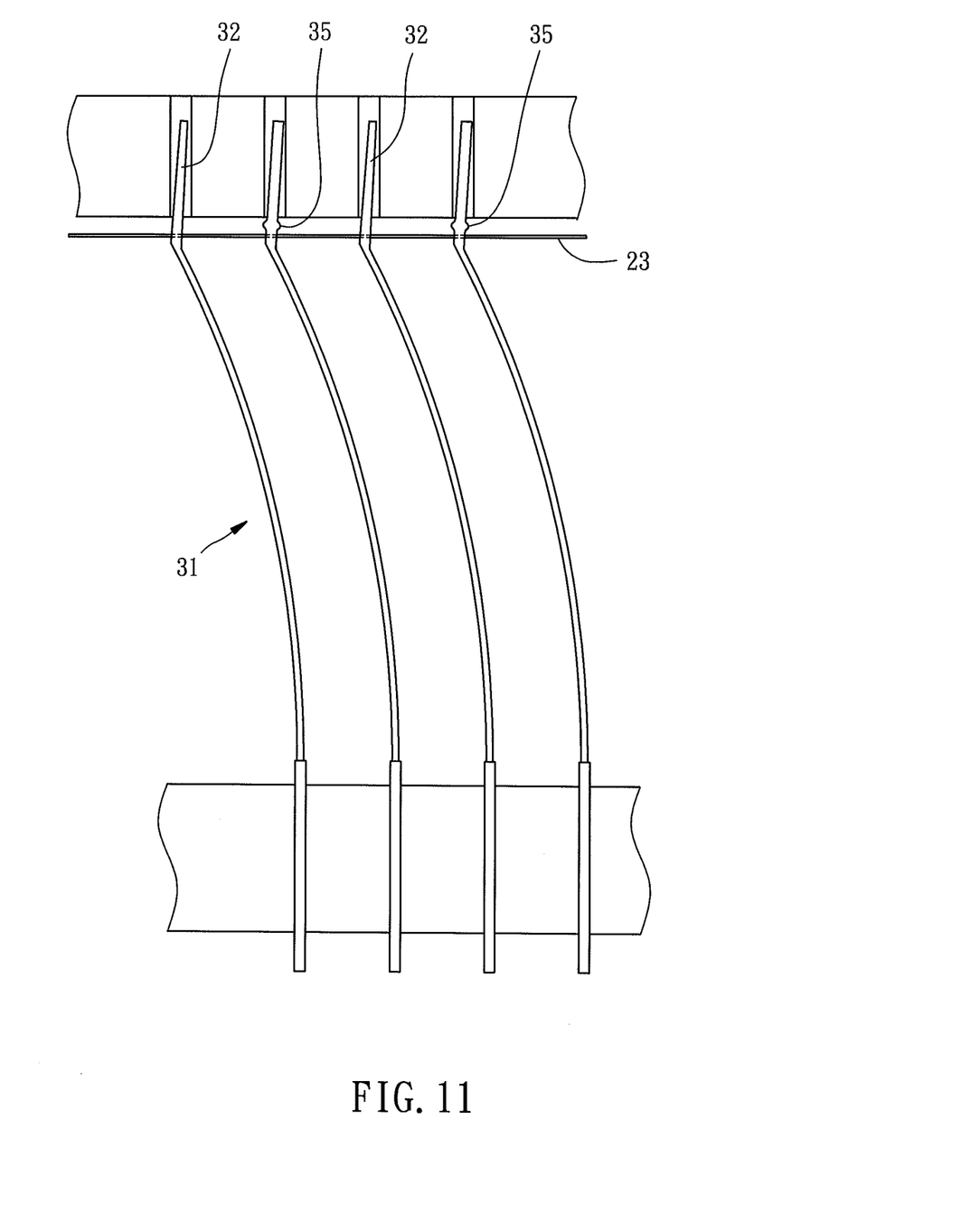
FIG. 11 is similar to FIG. 10 but showing that more probe needles of the second embodiment of the present invention are used in the probe module.

It is to be mentioned that it is not necessary to press-form the second flat section 35 on the body 33 of each of the probe needles 31 used in the probe module 30. In fact, as long as one of the probe needles 31 has the second flat section 35 as shown in FIG. 10, the probe module 30 is feasible. In an alternate modification as shown in FIG. 11, the probe needles 31 used in the probe module 30 may comprise a half of the probe needles 31 each having the second flat section 35 on the body 33 and the other haft of the probe needles 31 each having a reduced diameter of the head 32, e.g. a truncated cone head 32, without the second flat section 35, and the probe needles 31 of two types are alternately arranged one after another. Both designs disclosed in FIGS.

10 and 11 can ensure the positioning film 23 to be held in good position and effectively reduce the pitch between two adjacent probe needles 31.

Figure 12:
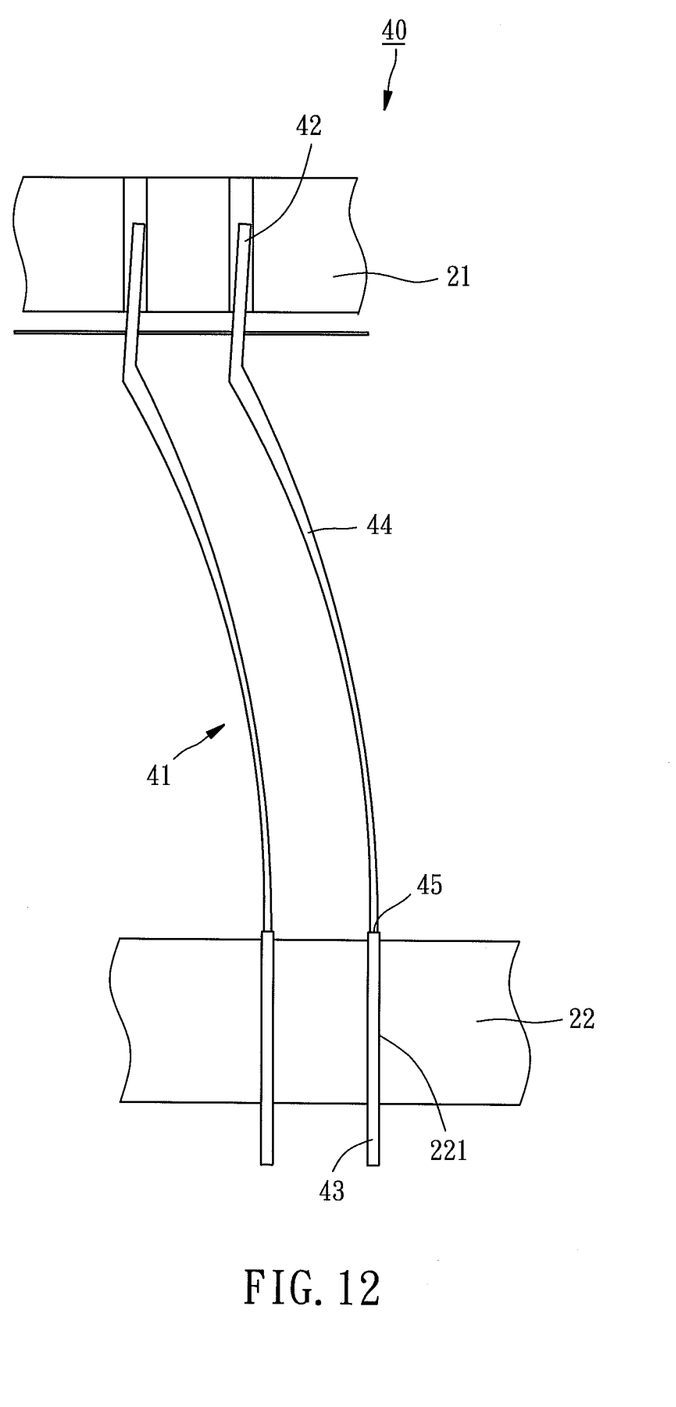
FIG. 12 is a schematic front view of a probe module using probe needles according to a third embodiment of the present invention.
Figure 13:
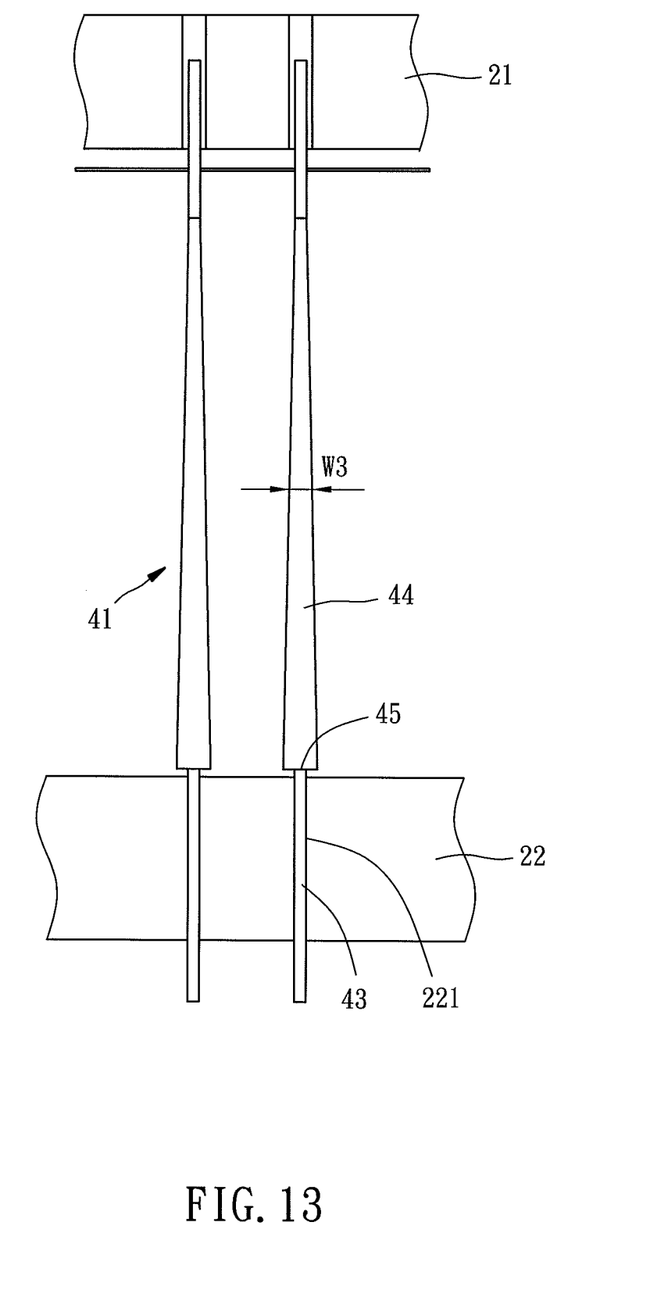
FIG. 13 is a schematic lateral side view of the probe module using the probe needles of the third embodiment of the present invention.
Figures 14, 15:
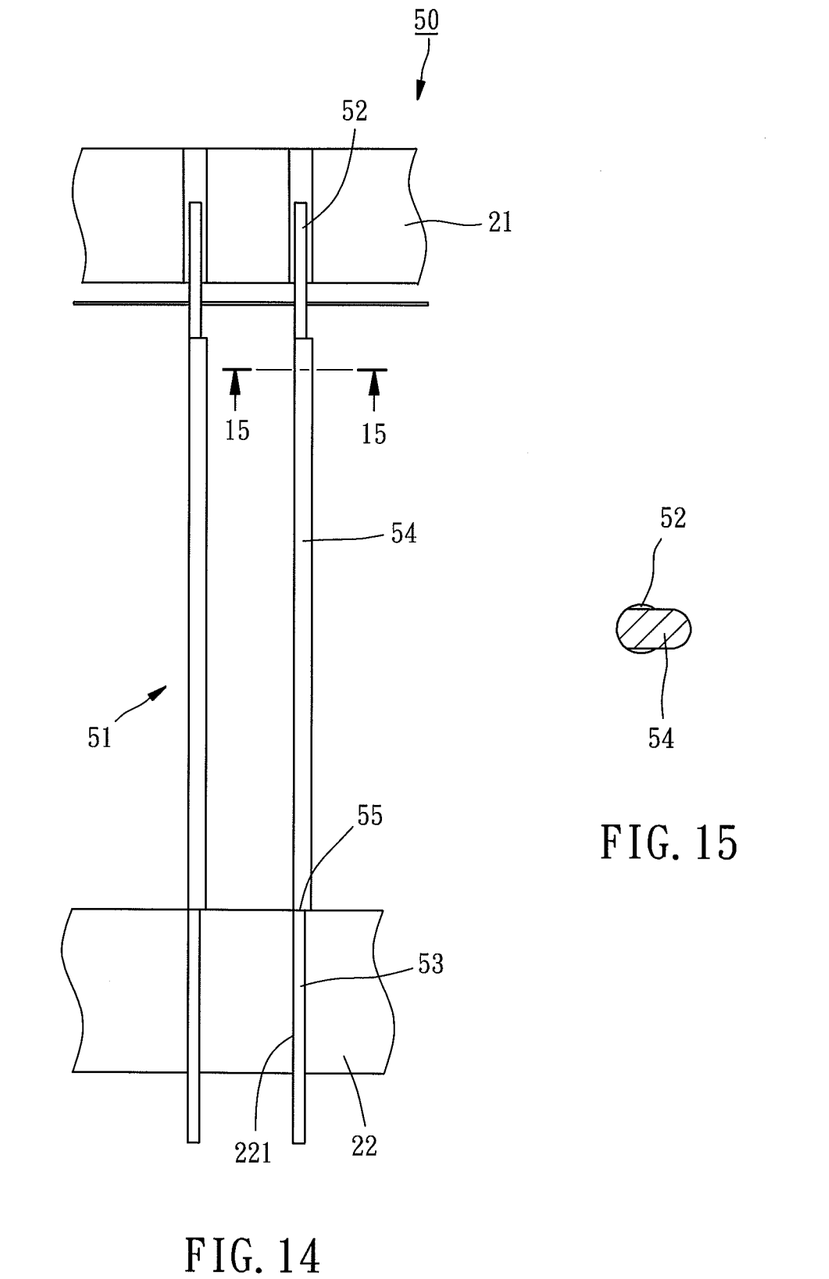
FIG. 14 is a schematic front view of a probe module using probe needles according to a fourth embodiment of the present invention.
FIG. 15 is a schematic sectional view of the probe needle of the fourth embodiment of the present invention taken along line 15-15 of FIG. 14.

FIGS. 12 and 13 show a probe module 40 using probe needles 41 provided in accordance with a third embodiment of the present invention. The probe needles 41 of this embodiment are different in structure from the probe needles of previous embodiments. Specifically speaking, the probe needle 41 includes a head 42, a tail 43, and a flat body 44 integrally connected between the head 42 and the tail 43 and curvedly extending from the head 42 towards the tail 43 in a way that the width W3 of the flat body 44 gradually increases from the head 42 towards the tail 43, so that the flat body 44 has a relatively narrower width at a top thereof and a relatively wider width at a bottom thereof. In this way, a stop portion 45 neighbored to the tail 43 and having a width greater than the diameter of the lower guide hole 221 of the lower die 22 is formed. By means of supporting the stop portion 45 on the surface of the lower die 22 that faces the upper die 21, the probe needle 41 can be positively held in between the upper and lower dies 21 and 22.

Because the probe needle 41 of the third embodiment is configured having a widest bottom of the flat body 44 serving as a stopper for supporting the probe needle 41 in between the upper and lower dies 21 and 22, and an upper section with a reduced width, this configuration of the probe needle 41 can reduce the risk of short circuit most likely caused by contact at the upper sections of two adjacent probe needles upon deformation. Therefore, the probe needle 41 of the third embodiment can achieve the same effect as the probe needles of the first and second embodiments do.

Referring to FIGS. 12 and 13, a probe module 50 using probe needles 51 provided in accordance with a fourth embodiment of the present invention is shown. The probe needle 51 of this embodiment includes a head 52, a tail 53, and a flat body 54 integrally connected between the head 52 and the tail 53 and curvedly extending from the head 52 towards the tail 53 with a constant width in a such way that a first side edge of the flat body 54 is in flush with the circumferences of the head 52 and the tail 53 and a second side edge that is opposite to the first side edge protrudes out of the circumferences of the head 52 and the tail 53, so that the bottom of the flat body 54 forms a stop portion 55 neighbored to the tail 53 and having a width greater than the diameter of the lower guide hole 221 of the lower die 22 for being supported on the lower die 22.

Compared to the flat body 136 of the conventional probe needle 13 shown in FIGS. 2 and 3, the flat body 54 of the probe needle 51 has a width that is reduced by almost about a half of the width of the flat body 136 of the conventional probe needle 13, such that the risk of short circuit caused by contact of two adjacent probe needles upon deformation will be reduced. By the design of the fourth embodiment, the probe needles 51 used in the probe module 50 may be arranged in a reduced pitch or may be press-formed from cylindrical posts having a relatively larger diameter than that of the cylindrical posts for making the conventional probe needles 13 according to actual needs. Therefore, the probe needle 51 of the fourth embodiment can achieve the same effect as the probe needles of the previous embodiments do.

In conclusion, the probe needles provided by the present invention can be arranged in a reduced pitch in a probe module so as to fulfill the design requirements of high density when they are press-formed from cylindrical posts having a same diameter of the cylindrical posts that are used for press-forming the conventional probe needles. Alternatively, the probe needles provided by the present invention can be arranged in a same pitch in a probe module as the conventional probe needles do when they are press-formed from cylindrical posts having a relatively greater diameter than that of the cylindrical posts that are used for press-forming the conventional probe needles, such that the probe needle of the present invention may have an enhanced current withstanding capacity and a prolonged lifespan compared to the conventional ones.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A probe needle comprising
   a head;
   a tail; and
   a body connected between the head and the tail the body including:
   a first flat section curvedly extending from the head towards the tail within a horizontal plane;
   a first flat section having a constant width; and
   a second flat section connected with an end of the first flat section; wherein the width of the first flat section is greater than a thickness of the second flat section; a diameter of the head and a diameter of the tail;
   wherein the first flat section has a thickness smaller than a width of the second flat section, the diameter of the head and the diameter of the tail,
   wherein the width of the second flat section is greater than the thickness of the first flat section, the diameter of the head and the diameter of the tail; and
   wherein the width of the second flat section extends horizontally in a first direction in the horizontal plane and the width of the first flat section extends horizontally in a second direction in a way that the first direction is not parallel to the second direction when the first and second directions are projected on the horizontal plane.

2. The probe needle as claimed in claim 1, wherein the second flat section is connected between the first section and the tail.

3. The probe needle as claimed in claim 1, wherein the second flat section is connected between the first section and the head.

4. The probe needle as claimed in claim 1, wherein the first direction is orthogonal to the second direction when the first and second directions are projected on the horizontal plane.

5. A probe module comprising:
   an upper die having at least two upper guide holes;
   a lower die having at least two lower guide holes; and
   at least two probe needles of claim 1 arranged in a way that the head of each of the probe needles is inserted in one of the upper guide holes, the tail of each of the probe needles is inserted in one of the lower guide holes, the first flat section of the body of each of the probe needles is located between the upper die and the lower die, and the second flat section of the body of each of the probe needles is stopped at a surface of the lower die that faces the upper die; the width of the second flat section of the body of each of the probe needles being greater than a diameter of each of the lower guide holes.

6. The probe module as claimed in claim 5, wherein the second flat section of the probe needle is connected between the first section and the tail of the probe needle.

7. A probe module comprising:
an upper die having at least two upper guide holes;
a lower die having at least two lower guide holes;
a positioning film disposed between the upper die and the lower die and having at least two positioning holes;
at least two probe needles of claim 1 arranged in a way that the head of each of the probe needles is inserted in one of the upper guide holes through one of the positioning holes of the positioning film, the tail of each of the probe needles is inserted in one of the lower guide holes, the first flat section of the body of each of the probe needles is located between the positioning film and the lower die, and the second flat section of the body of each of the probe needles is stopped at a surface of the positioning film that faces the upper die; the width of the second flat section of the body of each of the probe needles being greater than a diameter of each of the positioning holes.

8. The probe module as claimed in claim 7, wherein the second flat section of the probe needle is connected between the first section and the head of the probe needle.

* * * * *